(12) United States Patent
Hung et al.

(10) Patent No.: US 8,801,948 B2
(45) Date of Patent: Aug. 12, 2014

(54) TFT MASK REDUCTION

(75) Inventors: Ming-Chin Hung, Cupertino, CA (US);
Youngbae Park, San Jose, CA (US);
Chun-Yao Huang, Cupertino, CA (US);
Shih Chang Chang, Cupertino, CA (US); John Z. Zhong, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 36 days.

(21) Appl. No.: 13/610,712

(22) Filed: Sep. 11, 2012

(65) Prior Publication Data

US 2014/0004704 A1    Jan. 2, 2014

Related U.S. Application Data

(60) Provisional application No. 61/667,386, filed on Jul. 2, 2012.

(51) Int. Cl.
*B44C 1/22* (2006.01)
*C03C 15/00* (2006.01)
*C03C 25/68* (2006.01)
*C23F 1/00* (2006.01)

(52) U.S. Cl.
USPC ............................................. 216/41; 216/13

(58) Field of Classification Search
USPC .......................................... 216/41, 13
See application file for complete search history.

(56) References Cited

U.S. PATENT DOCUMENTS

| | | | |
|---|---|---|---|
| 7,602,456 B2 * | 10/2009 | Tanaka et al. | 349/43 |
| 7,830,464 B2 | 11/2010 | Song et al. | |
| 8,017,423 B2 | 9/2011 | Yoo et al. | |
| 8,154,696 B2 | 4/2012 | Song et al. | |
| 2012/0107982 A1 | 5/2012 | Song et al. | |

* cited by examiner

*Primary Examiner* — Roberts Culbert
(74) *Attorney, Agent, or Firm* — Fletcher Yoder PC

(57) ABSTRACT

Embodiments of the present disclosure relate to display devices and methods for manufacturing display devices. Specifically, embodiments of the present disclosure employ a halftone photoresist layer useful for reducing a number of masks needed to manufacture TFT backplane (e.g., thin-film transistors (TFTs) with fringe-field shifting). The halftone photoresist layer defines two areas, one defining an etching area for a first layer (e.g., a common voltage layer) and the other defining an etching area for a second layer (e.g., an organic passivation layer).

24 Claims, 11 Drawing Sheets

TFT MASK REDUCTION

CROSS REFERENCE TO RELATED APPLICATIONS

This application is a Non-Provisional Patent Application of U.S. Provisional Patent Application No. 61/667,386, entitled "TFT Mask Reduction", filed Jul. 2, 2012, which is herein incorporated by reference.

BACKGROUND

The present disclosure relates generally to electronic device displays, and, more particularly, to reducing a number of masks need to manufacture display panel thin film transistor (TFT) backplane.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

During the fabrication of electronic device displays, numerous masks may be used to define areas of deposition and/or etching to create patterned materials on the TFT backplanes. For example, materials may be dry-etched using a plasma etching machine on an area that is masked. Further wet-etching may pattern masked areas by use of certain chemicals, such as oxalic acid. Generally speaking, as the display panel TFT backplanes are fabricated, the number of masks may be directly proportional to the takt time, or overall completion time, needed to manufacture the display panel TFT backplane. As the number of masks increase, the takt time may increase due to, for example, mask alignment times and material preparation times (e.g., curing times) related to deposition and etching tasks associated with each mask. Increased takt times may result in certain inefficiencies, such as increased cost and reduced manufacturing capacity, which may result in manufacturing delays, etc.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

Embodiments of the present disclosure relate to devices and methods for reducing the number of masks needed to pattern a display panel TFT backplane. In some embodiments, an etching process may be used, in conjunction with a photoresist layer that includes a halftone pattern, to pattern multiple layers of display panel TFT backplane using a single mask. By using the single mask process described herein, the takt time for manufacturing the display panel TFT backplane may be reduced, resulting in manufacturing efficiencies such as decreased cost and increased manufacturing capacity.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
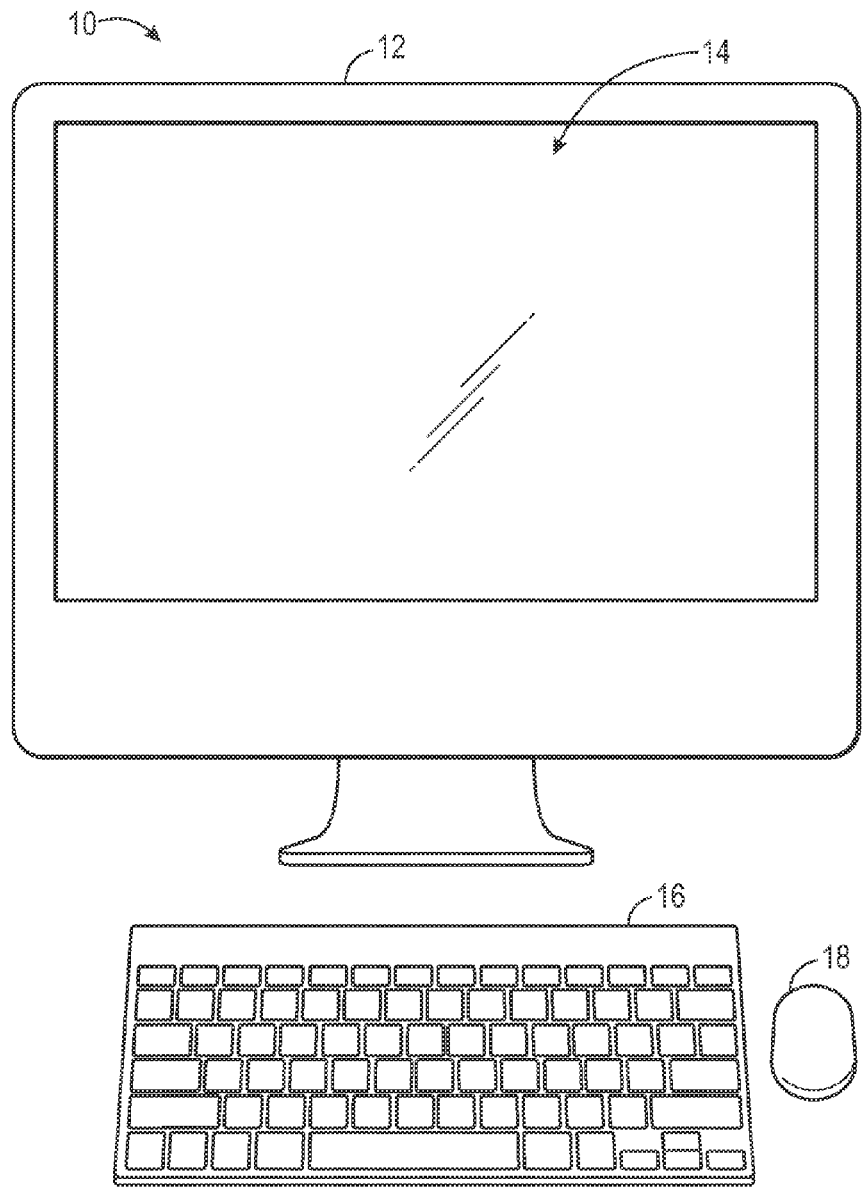
FIG. 1 is a schematic block diagram of an electronic device with a display manufactured using the halftone photoresist etching process described herein, in accordance with an embodiment.

FIG. 1 illustrates an electronic device 10 that may be manufactured using the techniques described herein. It should be noted that while the techniques will be described below in reference to illustrated electronic device 10 (which may be a desktop computer), the techniques described herein are usable with any electronic device employing a display. For example, other electronic devices may include a laptop computer, a tablet computer, a viewable media player, a mobile phone, a personal data organizer, a workstation, a standalone display, or the like. In certain embodiments, the electronic device may include a model of an iMac®, Mac® mini, Mac Pro®, MacBook®, a MacBook® Pro, MacBook Air®, Apple Cinema Display®, Apple Thunderbolt Display®, iPad®, iPod® or iPhone® available from available from Apple Inc. of Cupertino, Calif. In other embodiments, the electronic device may include other models and/or types of electronic devices or standalone displays, available from any manufacturer.

As illustrated in FIG. 1, electronic device 10 includes a housing 12 that supports and protects interior components, such as processors, circuitry, and controllers, among others, that may be used to generate images to display on display 14. Electronic device 10 also includes user input structures 16 and 18, shown here as a keyboard and a mouse, that may be manipulated by a user to interact with electronic device 10. For example, user input structures 16 and 18 may be employed to operate a graphical user interface (GUI) and applications running on electronic device 10. Input structures 16 and 18 may be connected to the electronic device 10 through a wired or wireless configuration. Further, in certain embodiments, electronic device 10 may include other types of user input structures, such as a touchscreen or trackpad, among others.

As described above, the display 14 may be manufactured using the halftone photoresist process described herein. The halftone photoresist process may reduce the manufacturing takt time for the display 14 by reducing the number of masks needed to manufacture the display 14. Accordingly, the display 14 may benefit from certain manufacturing efficiencies, such as decreased costs and/or manufacturing time.

Having discussed applications for the patterned photoresist process, the discussion now turns to a more detailed discussion of the halftone photoresist process, starting first with a process for applying and developing a photoresist layer useful for patterning multiple layers of a display panel TFT backplane and then describing a process for using the developed photoresist layer to pattern the multiple layers of the display panel TFT backplane.

Figure 2:
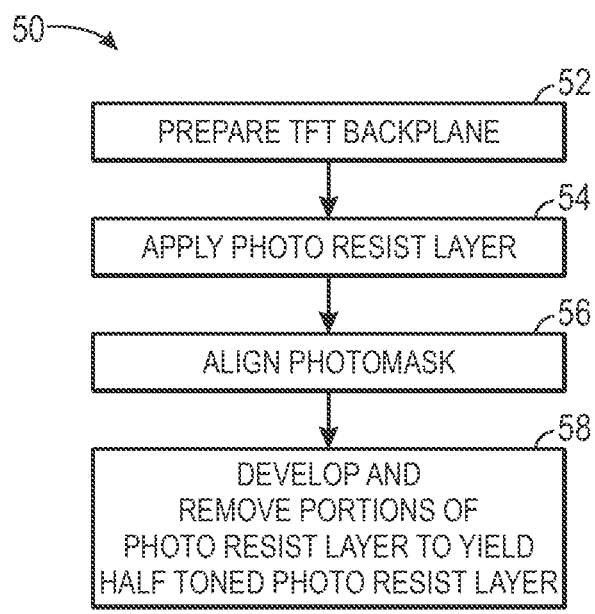
FIG. 2 is a flowchart describing a process for applying and developing a photoresist layer useful for patterning multiple layers of a TFT backplane, in accordance with an embodiment.

FIG. 2 illustrates a process 50 for applying and developing a photoresist layer that may be used to pattern multiple layers of a display panel TFT backplane. The process 50 begins by preparing the display panel TFT backplane (block 52) by depositing and patterning the preliminary layers of the display panel TFT backplane as well as depositing unpatterned layers of material that will be patterned via the halftone photoresist process. For example, as will be described in the example embodiment provided in FIG. 3, the preliminary layers that may be deposited and patterned on a substrate prior to applying the photoresist layer may include: gate lines, data lines, gate insulation layers, an active area, a source/drain, and/or a passivation layer deposited over the source/drain. Additionally, in the example embodiment provided, an organic passivation layer and common voltage (VCOM) layer are patterned using the halftone photoresist process, and thus are deposited but not patterned during preparation of the display panel TFT backplane.

After the display panel TFT backplane is prepared, the photoresist layer is applied to the display panel TFT backplane (block 54). The photoresist layer may include a light-sensitive material, such as a polymeric coating, designed to change properties upon exposure to light. Accordingly, when a mask is aligned (block 56) with the photoresist layer to only allow irradiation of a portion of the photoresist layer, development (block 58) of portions of the photoresist layer may occur. For example, in certain embodiments, a positive development polymer may be used to develop the photoresist layer. In such embodiments, the polymer may be more soluble after exposure to light. Accordingly, as light irradiates portions of the photoresist layer, those portions may be removed (e.g., by using an appropriate developer fluid), creating a pattern in the photoresist layer. In alternative embodiments, a negative development polymer may be used. In such embodiments, the polymer may be less soluble after irradiation by light. Accordingly, as light irradiates portions of the photoresist layer, the portions of the photoresist layer that are not irradiated may be removed (e.g., by using an appropriate developer fluid).

Figure 3:
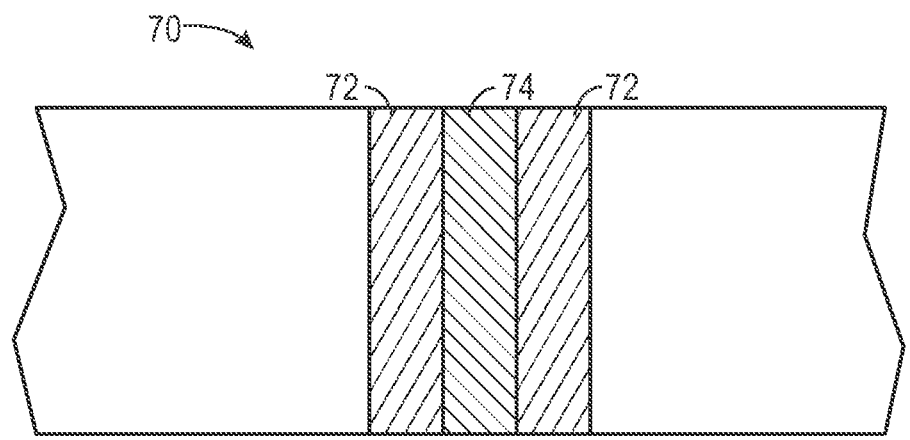
FIG. 3 is photomask useful for developing the photoresist, according to the process described in FIG. 2.

In either case, the photomask may be used to create a pattern in the photoresist layer that is useful for defining patterning areas for multiple layers of a display panel TFT backplane. FIG. 3 illustrates on embodiment of a photomask 70 useful for developing the photoresist layer such that a halftone pattern may be developed in the photoresist layer. As will be discussed in more detail below, with regards to FIG. 5, the halftone pattern may include a center portion where approximately the entire amount of material in the photoresist layer has been removed and two lateral portions surrounding the center portion where a lesser amount of material from the photoresist layer has been removed.

In the embodiment depicted in FIG. 3, a positive development polymer photomask 70 is illustrated, however, this is not intended to limit the halftone photoresist process to positive development photoresist layers. Indeed, in some embodiments, negative development photoresist layers and photomasks may be utilized.

The photomask 70 may include one or more patterns that enable specific amounts of light to irradiate specific portions of the photoresist layer, such that certain amounts of the photoresist layer may be removed at the specific locations. For example, in the provided embodiment of FIG. 3, patterns 72 enable some light to pass through to the photoresist layer, enabling removal of a portion of material in the photoresist layer aligned under the patterns 72. Pattern 74 may allow additional light to pass through to the photoresist layer, resulting in increased removal of material in the photoresist layer aligned underneath the pattern 74.

When the photomask 70 is aligned to the photoresist layer and light is applied, the patterns 72 and 74 may enable a halftone pattern to be developed in the photoresist layer. For example, as a first amount of light irradiates the positive development polymer through patterns 72 in the photomask 70, a first amount of material may be removed from the photoresist layer. For example, the patterns 72 may be configured to enable removal of half of the material in the photoresist layer underneath the patterns 72. Additionally, a second amount of light may reach the photoresist layer through pattern 74. Pattern 74 may enable the removal of all of the photoresist layer underneath the pattern 74. In some embodiments, pattern 74 may be aligned over a portion of a first layer (e.g., an organic passivation layer) that is to be removed. For example, in the illustrated embodiment, the pattern 74 may aligned over a portion the prepared drain of the display panel TFT backplane, as will become apparent with regards to FIGS. 5-12. Patterns 72 may be centered around pattern 74 and/or may be aligned over an area of a second layer (e.g., the VCOM layer) that may is to be removed.

Figure 4:
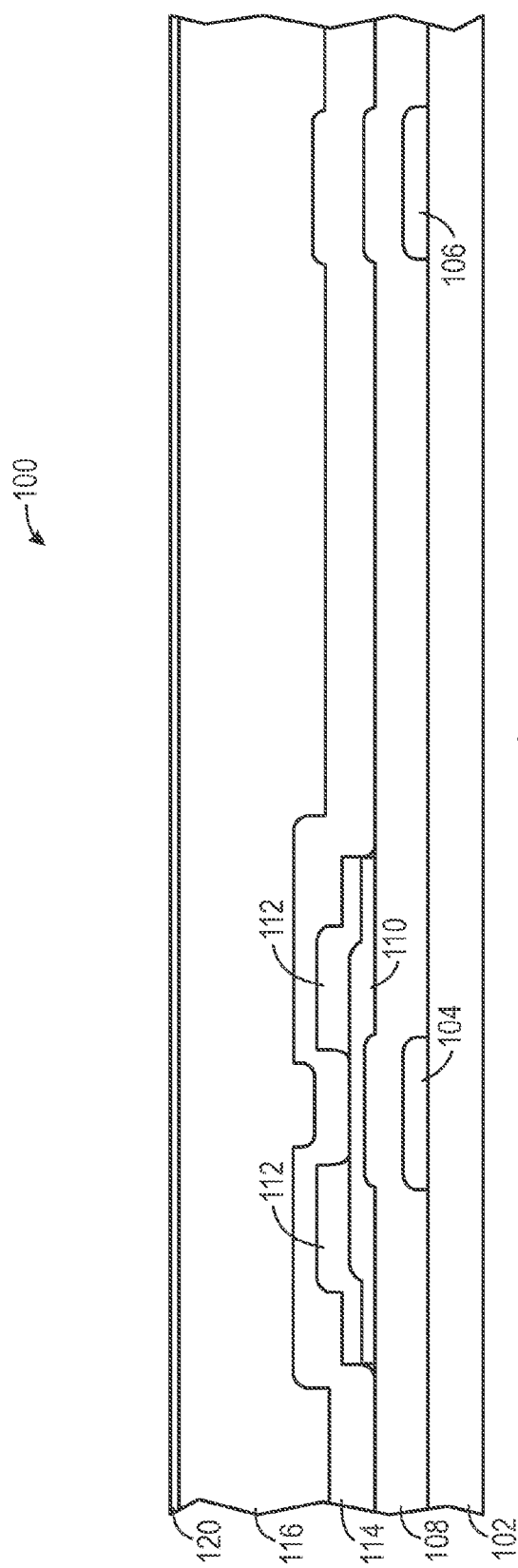
FIG. 4 is a schematic side view of display panel TFT backplane prepared to have the photoresist layer applied according to the process described in FIG. 2, in accordance with an embodiment.
Figure 5:
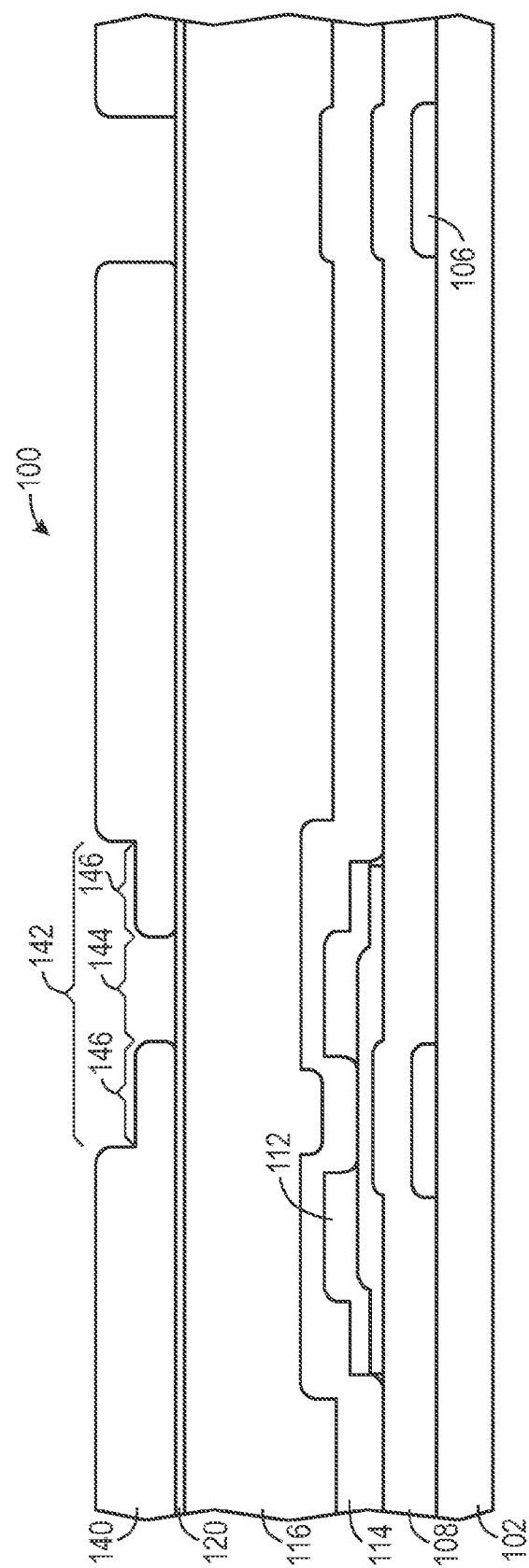
FIG. 5 is a schematic side view of the display panel TFT backplane of FIG. 5 with the photoresist mask applied and developed according to the process described in FIG. 2, in accordance with an embodiment.

FIGS. 4 and 5 illustrate a progression of applying and developing the photoresist layer using the photomask 70 of FIG. 3 according to the process 50 of FIG. 2. The display panel TFT backplane 100 may be circuitry that includes thin-film transistors (TFTs) with fringe-field switching. In other embodiments, the display panel TFT backplane 100 may be circuitry that includes TFTs with in-plane switching (IPS). As illustrated in FIG. 4 and discussed above, the display panel TFT backplane 100 is prepared by patterning layers on a substrate 102 prior to applying and developing the photoresist layer. In the illustrated embodiment of FIG. 4, gate lines 104 and a common voltage supply line 106 are deposited on the substrate 102. The substrate layer 102 may act as a base for the display panel TFT backplane 100. The gate lines 104 provide scanning signals from driving circuitry of the display panel TFT backplane 100 to gates of thin-film-transistors connected to the respective gate lines 104. The common voltage supply line 106 may supply a common voltage to layers of the display panel TFT backplane 100 that are electrically coupled to the common voltage supply line 106. Further, a gate insulator 108 may be disposed over the gate lines 104. The gate insulator 108 may insulate the gate lines 104 from the outer layers of the display panel TFT backplane 100 and, in some embodiments, may consist of a silicon nitride (g-SiNX) or silicon dioxide (SiO2). An active layer 110 may be disposed over the gate insulator 108 and may act as an electricity transfer mechanism between a source/drain 112 coupled to the active layer 110. The source/drain 112 may be disposed over the active layer 110. The source may be coupled to data lines that may be used to transmit image data from a source driver of the display panel TFT backplane 100 to pixels of the display panel TFT backplane corresponding to the data lines 106. A source/drain passivation layer 114 may be disposed over the source/drain 112 and may insulate the source/drain 112 from outer layers of the display panel TFT backplane 100. In some embodiments, the source/drain passivation layer 114 may consist of a silicon oxide or silicon nitride. After each of these layers is patterned, the layers to be patterned by the halftone photoresist layer process may be deposited. For example, in the provided embodiment, the halftone photoresist layer process may be used to pattern an organic passivation layer 116 and a common voltage (VCOM) layer 120, and thus these layers may be deposited during the display panel TFT backplane 100 preparation (block 52 of FIG. 2). The organic passivation layer 116 may provide electrical stability by isolating various elements of the display panel TFT backplane 100 and, in some embodiments, may consist of an acrylic polymer, a cyclic olefin polymer, or spin-on-glass (SOG). The VCOM layer 120 may provide a shared common voltage to the display panel TFT backplane 100.

As discussed above, once the display panel TFT backplane 100 is prepared, the photoresist layer is applied and developed (e.g., according to blocks 54-58 of FIG. 2). FIG. 5 illustrates the display panel TFT backplane 100 where the photoresist layer 140 has been applied and developed on the display panel TFT backplane 100. As illustrated, the photoresist layer 140 includes a developed halftone pattern 142 that will define portions of the display panel TFT backplane 100 to be etched away.

As discussed above, the halftone pattern 142 may include a center portion 144 and two lateral portions 146. The center portion 144 may be formed by removing all of the material in the photoresist layer 140 at the center portion 144. The lateral portions 146 may be formed by removing half of the material in the photo resist layer 140 at the lateral portions 146. Accordingly, when the center portion 144 and lateral portions 146 are formed, the halftone pattern 142 is formed.

Figure 6:
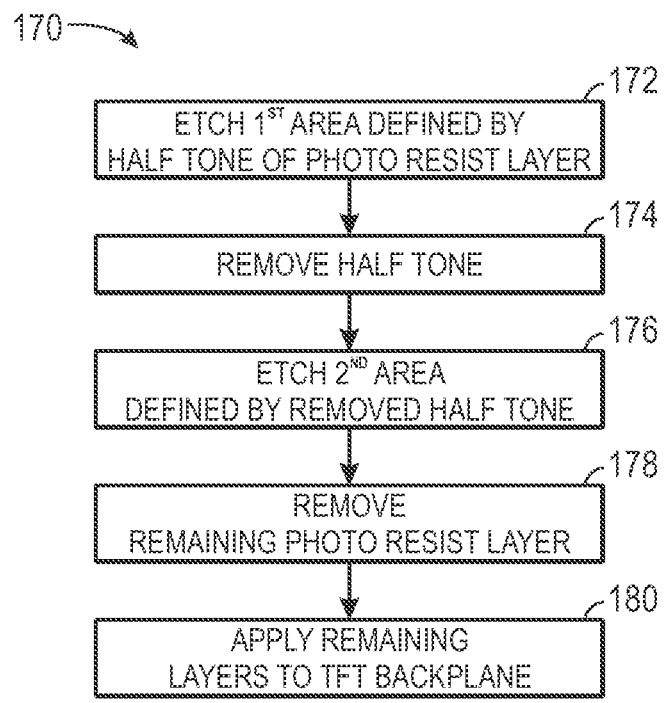
FIG. 6 is a flowchart describing an etching process for etching multiple layers of a display panel TFT backplane using the patterned photoresist layer developed from the process described in FIG. 2, in accordance with an embodiment.
Figure 7:
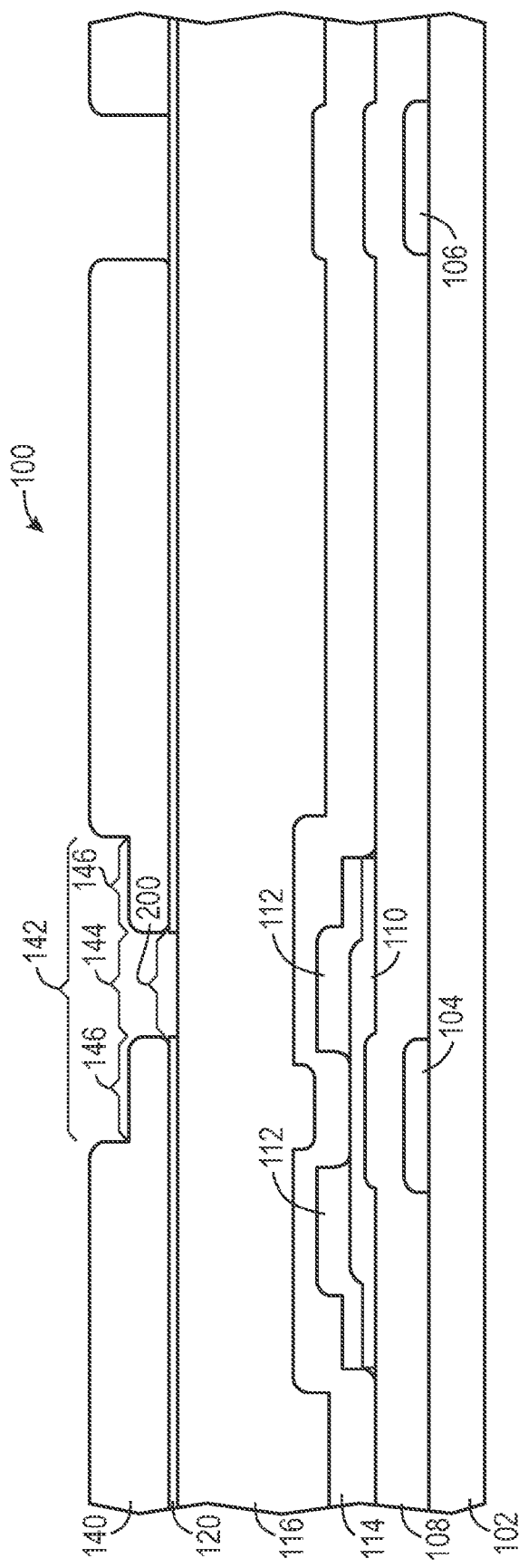
FIG. 7 is a schematic side view of the display panel TFT backplane of FIG. 5 where a common voltage (VCOM) layer of the display panel TFT backplane is etched according to the process described in FIG. 6, in accordance with an embodiment.

Turning now to a discussion of the etching process, FIG. 6 illustrates a process 170 for etching the multiple layers of the display panel TFT backplane using the patterned (e.g., halftone patterned) photoresist layer. FIGS. 7-12 illustrate an application of the process 170 on the display panel TFT backplane 100, and will be discussed jointly with FIG. 6 for clarity.

Figure 8:
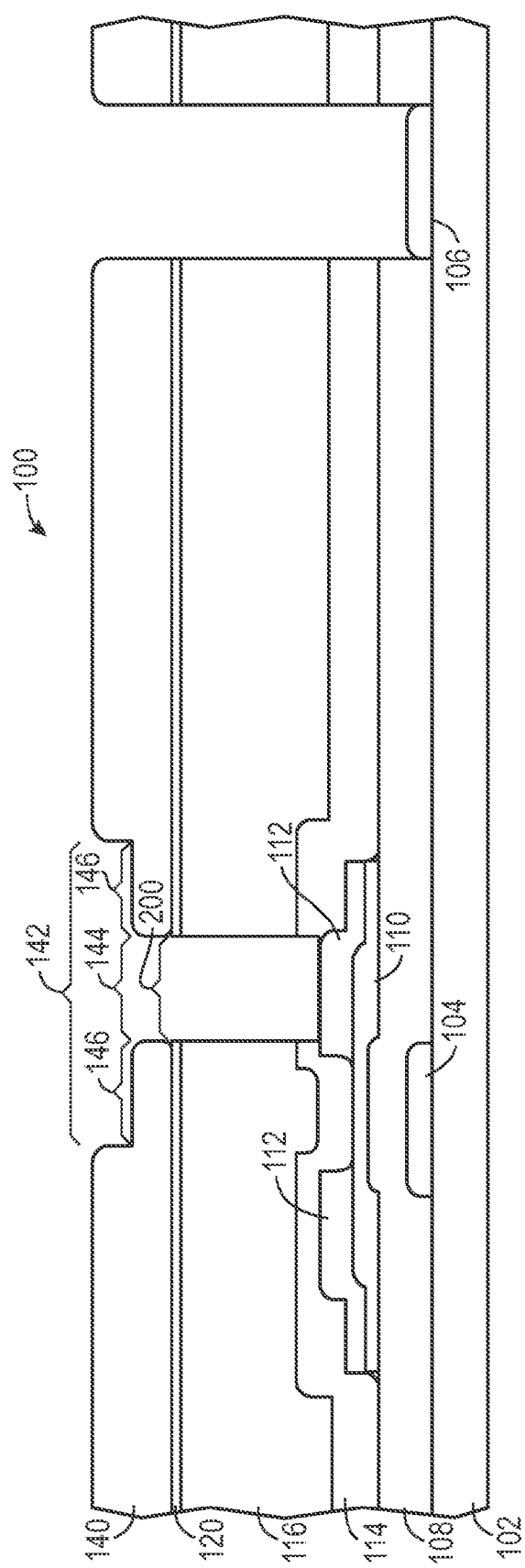
FIG. 8 is a schematic side view of the display panel TFT backplane of FIG. 7 where an organic passivation layer of the display panel TFT backplane is etched according to the process described in FIG. 6, in accordance with an embodiment.

The process 170 begins by etching a first area defined by the halftone pattern 142 of the photoresist layer 140 (block 172). Specifically, the first area 200 (depicted in FIG. 7) is defined by the portion of the photoresist layer 140 that was completely removed during the development of the photoresist layer 140 (e.g., the process 50 of FIG. 2). For example, in the embodiment depicted in FIG. 7, the VCOM layer 120 may be etched away (e.g., via wet etching) at the first area 200. Because the lateral portions 146 mask the first area 200, the photoresist layer 140 may ensure that the VCOM layer 120 is only wet etched at the first area 200. Additionally, as depicted in FIG. 8, other layers may be etched away at area 200. For example, as depicted, the organic passivation layer 116 may be etched away (e.g., via dry etching) at area 200.

Figure 9:
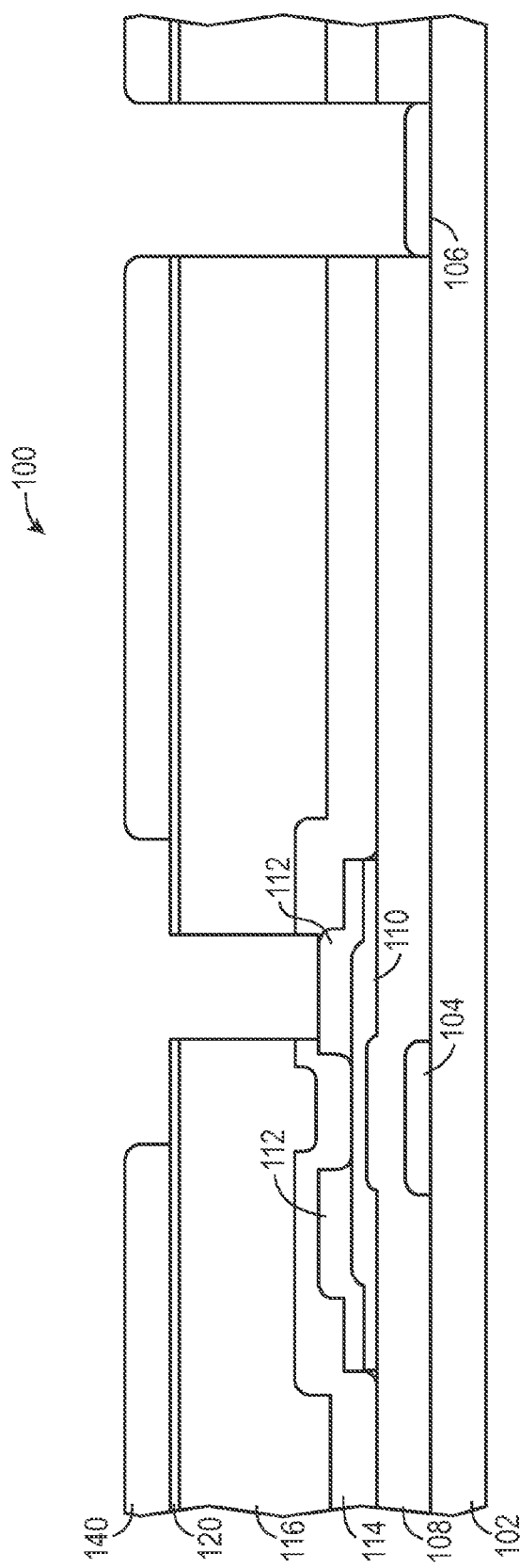
FIG. 9 is a schematic side view of the display panel TFT backplane of FIG. 8 where the halftone pattern of the photoresist layer is removed according to the process described in FIG. 6, in accordance with an embodiment.

As illustrated in FIG. 9, the process 170 continues by removing the halftone pattern in the photoresist layer 140 (block 174). In certain embodiments, as illustrated, the materials that make up the photoresist layer 140 may be reduced by approximately one-half, thus removing the halftone pattern 142 (e.g., by removing the lateral portions 146) and exposing the underlying layer (e.g., the VCOM layer 120).

Figure 10:
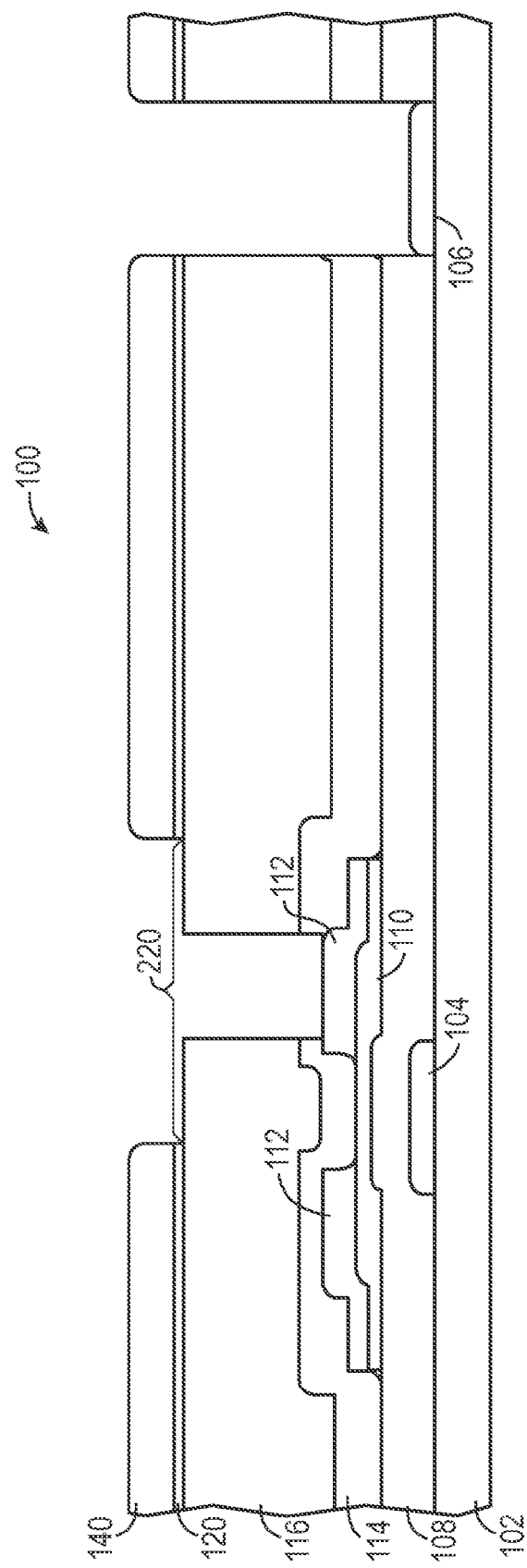
FIG. 10 is a schematic side view of the display panel TFT backplane of FIG. 9 where the VCOM layer of the display panel TFT backplane is further etched according to the process described in FIG. 6, in accordance with an embodiment.

Next, as illustrated in FIG. 10, the process 170 continues by etching of layers of a second area 220, defined by the removed halftone pattern. For example, in the illustrated embodiment, the VCOM layer is etched away (e.g., via wet etching) at second area 220.

Figure 11:
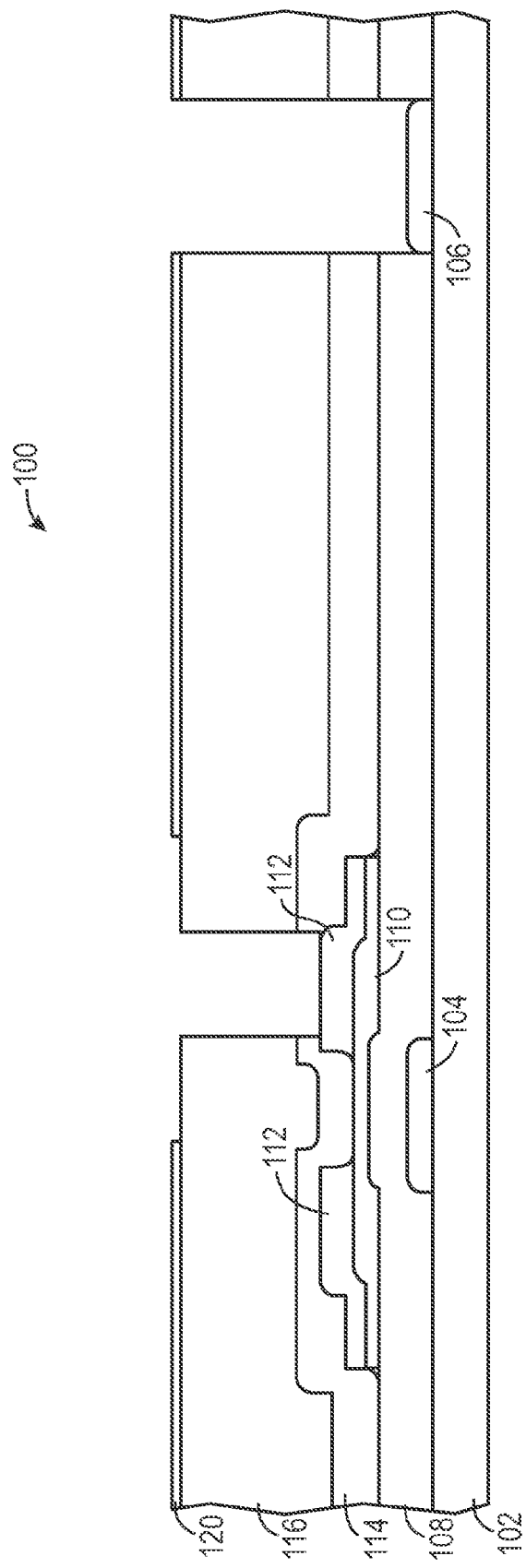
FIG. 11 is a schematic side view of the display panel TFT backplane of FIG. 10 where the remaining portions of the photoresist layer are removed according to the process described in FIG. 6, in accordance with an embodiment.
Figure 12:
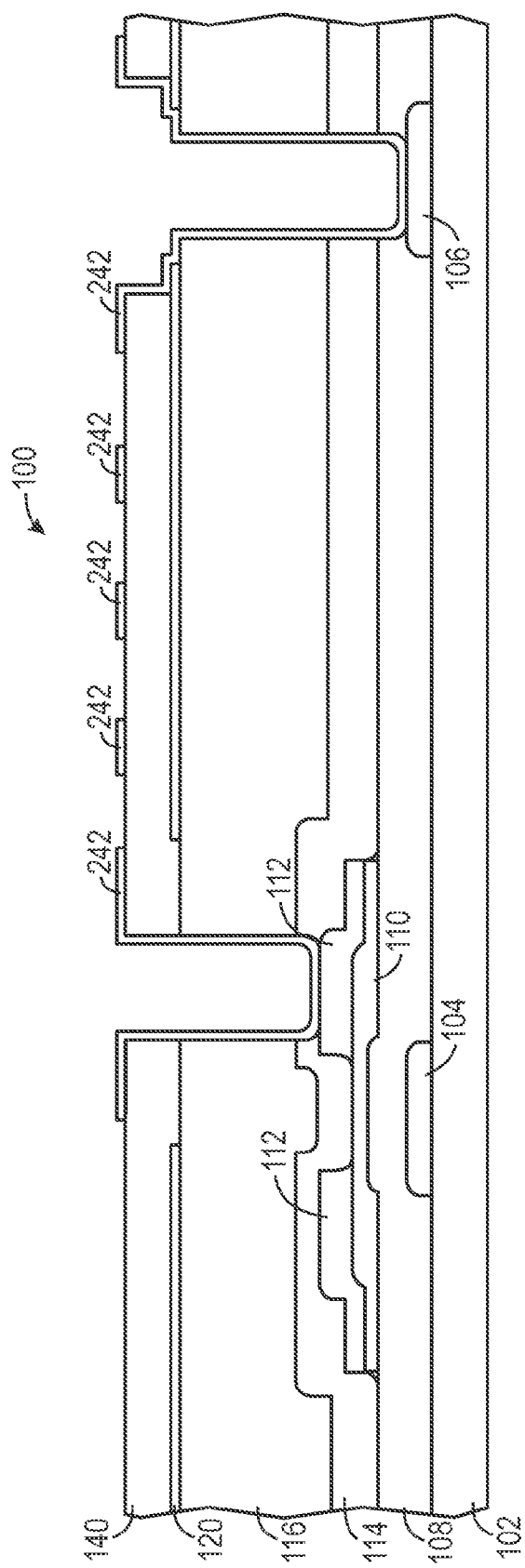
FIG. 12 is a schematic side view of the display panel TFT backplane of FIG. 10 where the display panel TFT backplane is completed according the process described in FIG. 6, in accordance with an embodiment.

As illustrated in FIG. 11, once etching of the second area 220 is completed, the remaining portions of the photoresist layer 140 of FIG. 10 may be removed. For example, in certain embodiments, the photoresist layer 140 may be removed via a photoresist stripping process or other method.

Once the remaining portions of the photoresist layer 140 are removed, the remaining layers of the display panel TFT backplane 100 may be deposited (block 180 of FIG. 6). For example, an additional VCOM passivation layer 240 (e.g., a silicon nitride or silicon oxide) and conductive pixel material (e.g., pixel indium tin oxide (ITO)) 242 may be deposited and patterned.

As may be appreciated, by implementing the process 170 discussed above, manufacturing efficiencies of the display panel TFT backplane 100 may increase. For example, the process 170 may reduce the number of masks necessary to pattern the organic passivation layer 116 and the VCOM layer 120. For example, rather than using separate masks to pattern the organic passivation layer 116 and the VCOM layer 120, a single mask (e.g., mask 70 of FIG. 3) may be used in the patterning processes for both the organic passivation lay 116 and the VCOM layer 120. By using a reduced number of masks, the takt time necessary to complete manufacturing may be reduced, thus decreasing manufacturing costs and increasing manufacturing capacities.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A method, comprising:
   applying a photoresist layer to a display panel TFT backplane, wherein the photoresist layer is configured to define a pattern having:
   a first area useful for etching a first layer of the display panel TFT backplane;
   a second area patterned laterally around the first area useful for etching a second layer of the display panel TFT backplane; and
   a third area laterally around the second area where none of the photoresist layer is removed.

2. The method of claim 1, wherein the first area is defined by a halftone pattern disposed in the photoresist layer and the second area is defined by removal of the halftone pattern.

3. The method of claim 2, comprising:
   etching at least a first portion of the display panel TFT backplane based at least in part upon the first area;
   removing the halftone pattern; and
   etching at least a second portion of the display panel TFT backplane based at least in part upon the second area.

4. The method of claim 3, comprising:
   removing any remaining portions of the photoresist layer after etching the at least second portion of the display panel TFT backplane; and
   applying any remaining layers of the display panel TFT backplane after the remaining portions of the photoresist layer are removed.

5. The method of claim 4, wherein applying the remaining layers comprises applying at least one of: a passivation layer or a conductive pixel layer.

6. The method of claim 5, wherein applying the conductive pixel layer comprises depositing indium tin oxide (ITO).

7. The method of claim 3, wherein:
   etching the first portion comprises etching a portion of a common voltage layer defined by the halftone pattern and etching a portion of an organic passivation layer, a portion of a source/drain passivation layer, a portion of a gate insulator layer, or a combination thereof, defined by the halftone pattern; and
   etching the second portion comprises etching a second portion of the common voltage layer defined by the removal of the halftone pattern.

8. The method of claim 3, wherein removing the halftone pattern comprises ashing at least a portion of the photoresist layer to remove lateral portions of the halftone pattern but not all of the photoresist layer.

9. A method, comprising:
   depositing a photoresist layer on display panel TFT backplane;
   aligning a photomask with the photoresist layer;
   developing and removing portions of the photoresist layer through use of the photomask to create a halftone pattern over first and second portions of first and second layers of the display panel TFT backplane to be etched away, wherein creating the halftone pattern comprises:
   removing all material in the photoresist layer in a center portion of the halftone pattern of the photoresist layer to define the first portion to be etched away, and
   partially removing some of the material in the photoresist layer in lateral portions of the halftone pattern of the photoresist layer surrounding the center portion, while retaining all of the material in the photoresist layer in portions of the photoresist layer surrounding the lateral portions of the halftone pattern, to define the second portion to be etched away.

10. The method of claim 9, wherein partially removing some of the material in the photoresist layer in the lateral portions comprises removing approximately half of the photoresist layer in the lateral portions.

11. The method of claim 9, wherein the first layer comprises an organic passivation layer, a source/drain passivation layer, a gate insulator layer, or a combination thereof.

12. The method of claim 9, wherein the second layer comprises a common voltage (VCOM) layer.

13. The method of claim 9, wherein the first portion defines a portion of an organic passivation layer, a portion of a source/drain passivation layer, a portion of a gate insulator layer, or a combination thereof, to be etched away.

14. The method of claim 9, wherein the second portion defines a portion of a common voltage (VCOM) layer to be etched away.

15. The method of claim 9, wherein the center portion is centered over a source/drain of the display panel TFT backplane, such that layers above the source/drain may be etched away.

16. The method of claim 9, wherein the lateral portions span an area of a common voltage (VCOM) layer to be etched away based at least in part upon an area for a planned deposit of conductive pixel material.

17. The method of claim 9, wherein applying the photoresist layer comprises applying the photoresist layer over portions of the display panel TFT backplane that do not extend over a portion of the display panel TFT backplane where a common voltage source resides.

18. The method of claim 9, wherein depositing the photoresist layer on display panel TFT backplane comprises:
   depositing the photoresist layer over the entire display panel TFT backplane; and
   removing a portion of the photoresist layer over an area of the display panel TFT backplane where a common voltage source is disposed.

19. The method of claim 18, wherein removing the portion of the photoresist layer comprises ashing the portion of the photoresist layer over the area of the display panel TFT backplane where the common voltage source is disposed.

20. A method, comprising:
   manufacturing an electronic display device using a single photomask to pattern two layers of TFT backplane of the electronic display device, wherein the two layers are etched with different etching areas, wherein the photomask comprises a pattern having:
   a first area useful for etching a first layer of the two layers;
   a second area patterned laterally around the first area useful for etching a second layer of the two layers; and
   a third area laterally around the second area where none of the photoresist layer is removed.

21. The method of claim 20, comprising:
   applying a photoresist layer to the TFT backplane;
   using the photomask to create the pattern in the photoresist layer, wherein the pattern defines first and second etching areas;
   etching the first layer, the second layer, or both based upon the first etching area; and
   etching the first layer, the second layer, or both based upon the second etching area.

22. The method of claim 21, wherein the pattern comprises a halftone pattern comprising a center section where the photoresist layer is completely removed and lateral sections where the photoresist layer is partially removed.

23. The method of claim 22, comprising:
ashing the lateral sections after etching the first layer, the second layer or both based upon the first etching area; wherein the second etching area is defined by the ashed lateral sections.

24. The method of claim 23, comprising:
removing, via an ashing process, the photoresist layer after etching the first layer, the second layer, or both based upon the second etching area; and completing the manufacturing of the TFT backplane.

* * * * *